United States Patent
Moss et al.

(10) Patent No.: US 7,925,912 B1
(45) Date of Patent: Apr. 12, 2011

(54) METHOD AND APPARATUS FOR FINE EDGE CONTROL ON INTEGRATED CIRCUIT OUTPUTS

(75) Inventors: Roy G. Moss, Palo Alto, CA (US);
Douglas G. Keithley, Boise, ID (US);
Richard N. Woolley, Mountain View, CA (US)

(73) Assignee: Marvell International Ltd., Hamilton (BM)

( * ) Notice: Subject to any disclaimer, the term of this patent is extended or adjusted under 35 U.S.C. 154(b) by 758 days.

(21) Appl. No.: 11/831,554

(22) Filed: Jul. 31, 2007

Related U.S. Application Data

(60) Provisional application No. 60/820,884, filed on Jul. 31, 2006.

(51) Int. Cl.
| | |
|---|---|
| G06F 1/00 | (2006.01) |
| G06F 1/12 | (2006.01) |
| G06F 19/00 | (2006.01) |
| G06F 15/167 | (2006.01) |
| G06F 3/00 | (2006.01) |
| G06F 12/00 | (2006.01) |
| H03K 19/00 | (2006.01) |
| H03K 5/01 | (2006.01) |
| H03K 21/00 | (2006.01) |
| H04L 7/00 | (2006.01) |

(52) U.S. Cl. .......... 713/500; 713/400; 713/600; 326/93; 327/100; 375/354; 377/27; 702/124; 709/214; 710/58; 711/5; 711/167

(58) Field of Classification Search .................. 713/400, 713/500, 600; 326/93; 327/100; 375/354; 702/124; 709/214; 710/58; 711/5, 167; 377/27

See application file for complete search history.

(56) References Cited

U.S. PATENT DOCUMENTS

| | | | | |
|---|---|---|---|---|
| 4,821,295 | A * | 4/1989 | Sanner .................. | 375/360 |
| 5,742,188 | A * | 4/1998 | Jiang et al. ............ | 327/99 |
| 7,015,726 | B1 * | 3/2006 | Tayler et al. .......... | 327/24 |
| 7,698,588 | B2 * | 4/2010 | Boerstler et al. ...... | 713/400 |

* cited by examiner

*Primary Examiner* — Stefan Stoynov

(57) ABSTRACT

A device for adjusting the timing of at least one edge of an output pulse created in response to a reference pulse is disclosed. Such a device may include a first memory circuit having two or more first memory cells and a second memory circuit also having two or more second memory cells. The first memory circuit may be configured to periodically sample the reference pulse at the rising edges of a first sample clock while the second memory circuit may be configured to periodically sample the reference pulse at the falling edges of the first sample clock. A combinatorial logic circuit may also be included to produce the output pulse having at least one adjusted edge based on a set of timing instructions and timing information provided by the first and/or second memory circuits.

44 Claims, 16 Drawing Sheets

US 7,925,912 B1

METHOD AND APPARATUS FOR FINE EDGE CONTROL ON INTEGRATED CIRCUIT OUTPUTS

INCORPORATION BY REFERENCE

This application claims the benefit of U.S. Provisional Application No. 60/820,884 "Method and Apparatus for Fine Edge Control on Integrated Circuit Outputs" filed on Jul. 31, 2006, including all cited references, all of which are incorporated herein by reference in their entirety.

BACKGROUND

Application Specific Integrated Circuits (ASICs) are customized, bialy compact electronic devices commonly used in many consumer applications where a large number of sales may be used to offset initial development costs. By way of example, cellular telephones and digital cameras almost always employ at least one ASIC in order to perform a number of common functions, such as controlling displays, monitoring various control buttons and performing high speed processing that generally cannot be performed by a microcontroller.

Unfortunately, while an ASIC may be crafted to work with a particular set of peripherals, the manufacturers of electronic devices may often need to use a variety of suppliers for a given peripheral. For example, a manufacturer of digital cameras may need to use three separate suppliers of an M-by-N charge couple device (CCD) imaging array for a single camera model. While the various CCD imaging arrays may be identical in function and form, there may be subtle but substantial differences in other aspects of the CCDs, such as minute but critical differences in timing requirements. For instance, while a first CCD imaging array and a second CCD imaging array may be an exact match in their general form and functionality, the first CCD array may provide its analog output signals a few nanoseconds later than the second CCD imaging array. As a result, the use of the first CCD imaging array may introduce noise that, without some form of timing compensation, may cause a degradation of picture quality.

While different suppliers of electronic devices have used a variety of methods to achieve compensation of critical timing pulses, these methods tend to be analog in nature and therefore subject to substantial variations in performance over time, temperature and manufacturing process discrepancies.

SUMMARY

A signal edge adjuster is disclosed that includes one or more edge detectors that generates edge signals based on rising and falling edges of an input signal. The signal edge adjuster includes delay circuits that delay the edge signals output by the edge detectors and an output synthesizer that generates an output signal based on the delayed edge signals.

In particular, the signal edge adjuster may include a first memory circuit and a second memory circuit each of which may include two or more memory cells. The first memory circuit may periodically sample a reference pulse (the input signal) at the rising edges of a first sample clock while the second memory circuit may periodically sample the reference pulse at the falling edges of the first sample clock. A combinatorial logic circuit may be included to synthesize an output pulse having at least one adjusted edge based on a set of timing instructions and at least one of the positive sample output signals and the negative sample output signals.

BRIEF DESCRIPTION OF THE DRAWINGS

The fine-edge adjustment devices and methods are described with reference to the following figures, wherein like numerals reference like elements, and wherein.

DETAILED DESCRIPTION OF EMBODIMENTS

As will be discussed below, the disclosed methods and systems may allow for fine adjustments of rising and/or falling edges of control pulses that may optimize (or at least improve) the performance of a given system. The techniques employed may possibly enable designers to achieve such improvements without using analog delays or other analog components that may be subject to process variations, age, temperature and a host of other problems. The techniques employed may also possibly allow for fine edge control without the need to propagate incompatible sample clock signals within a given system.

Figure 1:
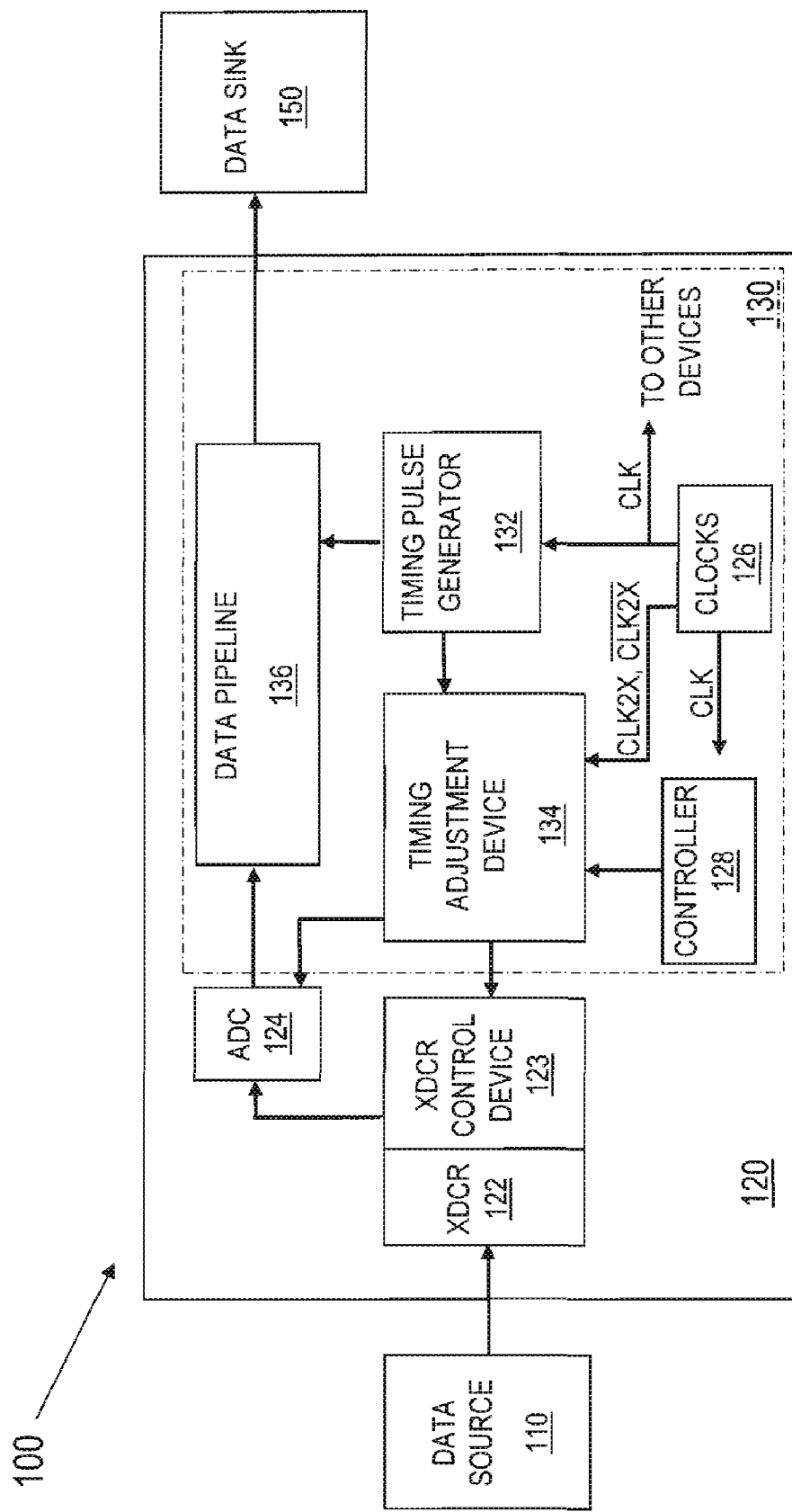
FIG. 1 is a block diagram of an exemplary data manipulation system that includes an adaptable data acquisition system.

FIG. 1 is an exemplary data manipulation system 100. As shown in FIG. 1, data manipulation system 100 may include a data source 110, a data acquisition device 120 and a data sink 150. As also shown in FIG. 1, data acquisition device 120 may include a transducer 122 with transducer control device 123, an analog to digital converter (ADC) 124, a number of clocks 126, a controller 128 and logic block 130. Logic block 130 may include clocks 126, controller 128, a timing pulse generator 132, a timing adjustment device 134 and a data pipeline 136. ADC 124 may also be included in logic block 130 if desired.

In operation, a data signal may be provided by data source 110 to transducer 122. Under control of transducer control device 123, transducer 122 may change the data signal from a first form, e.g., a magnetic field, modulated light signal or image, to an output signal having an electrical form. The electrical output signal may then be fed to ADC 124 by transducer control device 123. ADC 124 may then convert the received electrical signal from analog form to a stream of digital data, and feed the stream of digital data to data pipeline 136.

As data pipeline 136 receives the stream of digital data, data pipeline 136 may temporarily store the stream of digital data and possibly convert the stream of digital data to a form more appropriate for data sink 150. For example, data pipeline 136 may convert the stream of digital data into blocks of data having error correction coding, then perform a modulation process on the various coded blocks such that the coded blocks may be written onto data sink 150 when data sink 150 takes such forms as a VCR, a digital tape drive, a DVD and so on.

In order to control transducer 122, ADC 124 and pipeline 136, logic block 130 may provide a number of synchronized clock signals and advantageously timed pulses. For example, assuming transducer 122 is a CCD imaging array, logic block 130 may provide a common 100 MHz clock to data pipeline 136 and ADC 124 while providing a favorably timed stream of pulses to transducer control device 123 such that the effects of crosstalk between CCD pixels appearing at the input of ADC 124 is minimized.

Various clock signals of interest may be provided by clocks 126, while the critically-timed pulses may be provided by timing pulse generator 132 and timing adjustment device 134. Note that while most complex electronic products may have well defined timing relationships between various devices, it should be appreciated that these timing relationships may vary as device manufacturers use a variety of suppliers for certain components. For instance, using the CCD imaging array example above, the substitution of a first CCD imaging array for a second CCD imaging array (for transducer 122) may require a slightly different timing arrangement, e.g., a control pulse having a slightly advanced rising edge and slightly delayed falling edge, in order to avoid degradation of picture quality. In order to compensate for variations caused by different CCD imaging array vendors, timing adjustment device 134 (under control of controller 128) may be made to finely adjust the timing of such control pulses.

In various embodiments, data source 110 may be any number of known or later developed data communication systems, data collection systems or data storage systems. For example, data source 110 may be a fiber-optic communication system, an optical focusing system, a wireless transmitter, an electrical transmission system (e.g., an Ethernet LAN), an optical storage medium, a magnetic hard disk drive, an electronic memory and so on. Similarly, data sink 150 may be any number of known or later developed data communications or storage systems capable of receiving signals produced by a data acquisition device 120.

Depending on the nature of data source 110, transducer 122 may be any number of known or later developed transducer systems, such as a CCD imaging array, a microphone, magnetic head reader for a hard disk drive, an optical-to-electrical transducer, a transimpedance amplifier, a voltage buffer, an antenna for use with a wireless communication system and the like. Note, however, that there may be circumstances where data source 110 may be eliminated or not viewed as a man-made construct. For instance, assuming that data acquisition device 120 is a camera or a tape recorder, data source 110 may be eliminated.

While exemplary logic block 130 may be implemented as an Application Specific Integrated Circuit (ASIC), it should be appreciated that logic block 130 may also be implemented in any number of other forms including custom logic, non-custom logic, programmable logic and various combinations thereof as found necessary or advantageous.

Figure 2:
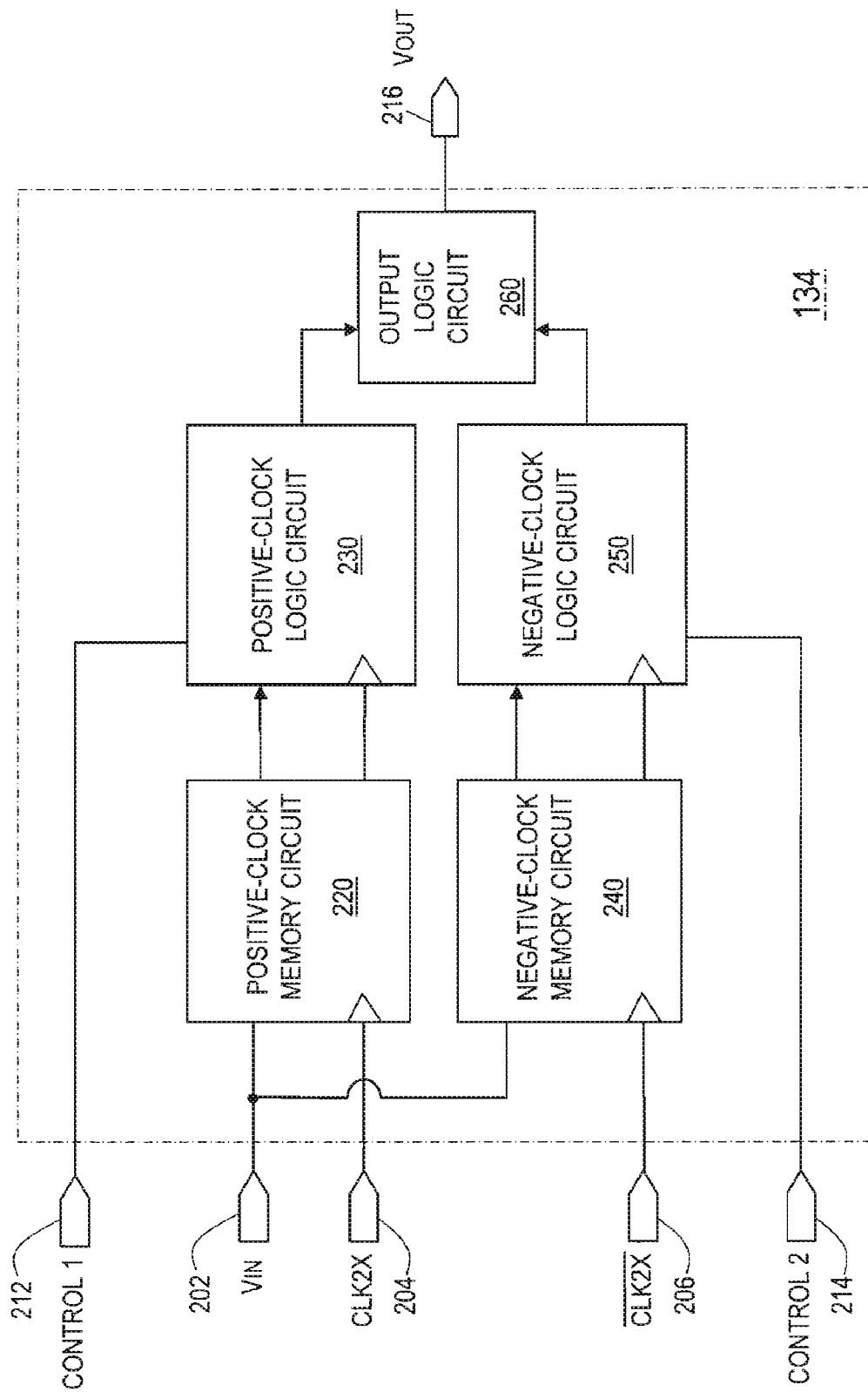
FIG. 2 is a block diagram of an exemplary timing adjustment device shown in FIG. 1.

FIG. 2 is a block diagram of exemplary timing adjustment device 134 of FIG. 1. As shown in FIG. 2, timing adjustment device 134 may include a positive-clock memory circuit 220 concatenated with a positive-clock logic circuit 230, a negative-clock memory circuit 240 concatenated with a negative-clock logic circuit 250 and an output logic circuit 260 coupled to positive-clock logic circuit 230 and negative-clock logic circuit 250.

In operation, positive-clock logic circuit 230 and negative logic circuit 250 can receive sets of timing instructions (CONTROL 1, CONTROL 2) from control nodes 212 and 214 in order to enable positive-clock logic circuit 230 and negative-clock logic circuit 250 to internally configure (or reconfigure) as desired. As also shown in FIG. 2, positive-clock memory circuit 220 and positive-clock logic circuit 230 may receive a first high-speed/sample clock signal (CLK2X) via node 204, while negative-clock memory circuit 240 and negative-clock logic circuit 250 may receive a second high-speed/sample clock (/CLK2X) via node 206.

Note that for the present embodiment the two high-speed/sample clock signals CLK2X and /CLK2X are inverted versions of one another, i.e., identical in frequency but effectively out of phase by 180 degrees. Also note that two complementary sample clock signals CLK2X and /CLK2X are used for ease of explanation as much conventional logic relies on positive-edge triggering and positive pulses. However, it should be appreciated that a single sample clock may be used with the understanding that various circuitry may be altered to respond to negative-edges and negative pulses where appropriate.

Assuming that positive-clock logic circuit 230 and negative-clock logic circuit 250 are appropriately configured and that circuits 220-250 are receiving the appropriate clock signals, a reference pulse may be provided to positive-clock memory circuit 220 and negative-clock memory circuit 240 via node 202 ($V_{IN}$). The reference pulse can then be sampled by the positive-clock memory circuit 220 and negative-clock memory circuit 240, and output signals representative of timing samples taken by the positive-clock memory circuit 220 and negative-clock memory circuit 240 may be respectively fed into positive-clock logic circuit 230 and negative-clock logic circuit 250 for processing. In turn, positive-clock logic circuit 230 and negative-clock logic circuit 250 may provide their respective processed outputs to output logic circuit 260, which in turn may provide an output pulse $V_{OUT}$ 216 having finely adjusted rising and/or falling edges.

Further details about positive-clock memory circuit 220 and negative-clock memory circuit 240 will be discussed below with respect to FIGS. 3 and 4. The functionality of positive-clock logic circuit 230 will be discussed below with respect to FIGS. 5 and 6. The functionality of negative-clock logic circuit 250 will be discussed below with respect to FIGS. 7 and 8. The functionality of output logic circuit 260 will be discussed below with respect to FIGS. 9-12.

Figure 3:
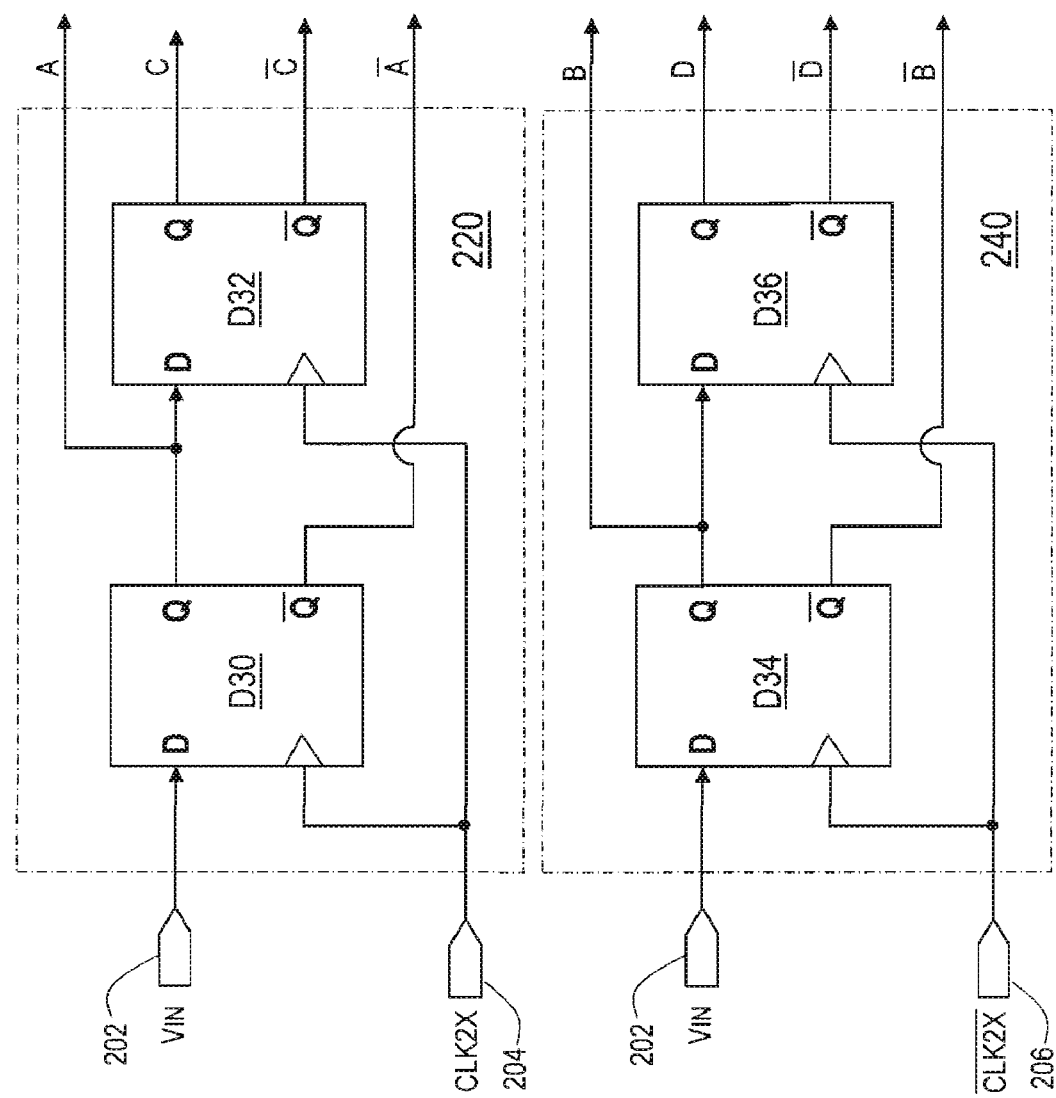
FIG. 3 is a schematic diagram of the exemplary positive-clock memory circuit and negative-clock memory circuit of FIG. 2.

FIG. 3 is a schematic of an exemplary positive-clock memory circuit 220 and negative-clock memory circuit 240. As shown in FIG. 3, positive-clock memory circuit 220 includes a first memory cell D30 and a second memory cell D32, and negative-clock memory circuit 240 includes a first memory cell D34 and a second memory cell D36. As also shown in FIG. 3, memory cells D30 and D32 are controlled by sample clock signal CLK2X (via node 204) while memory cells D34 and D36 are controlled by sample clock /CLK2X (via node 206).

While memory cells D30-D36 are logic circuits known as "delay flip-flops," in various other embodiments, memory cells D30-D36 may take any number of other forms including any other type of known or later-developed flip-flops, negative-edge flip-flops, transparent latches, static RAM memory cells, dynamic RAM memory cells, capacitive tap-delay cells or any other known or later-developed device capable of receiving a digital input, sampling the digital input and providing output representative of the sampled input signal at a later time.

Additionally, while sample clock signals CLK2X and /CLK2X may be complementary versions of one another, as mentioned above it may be advantageous to use a single sample clock, e.g., CLK2X, while substituting memory cells D34 and D36 with negative-edge delay flip-flops.

Figure 4:
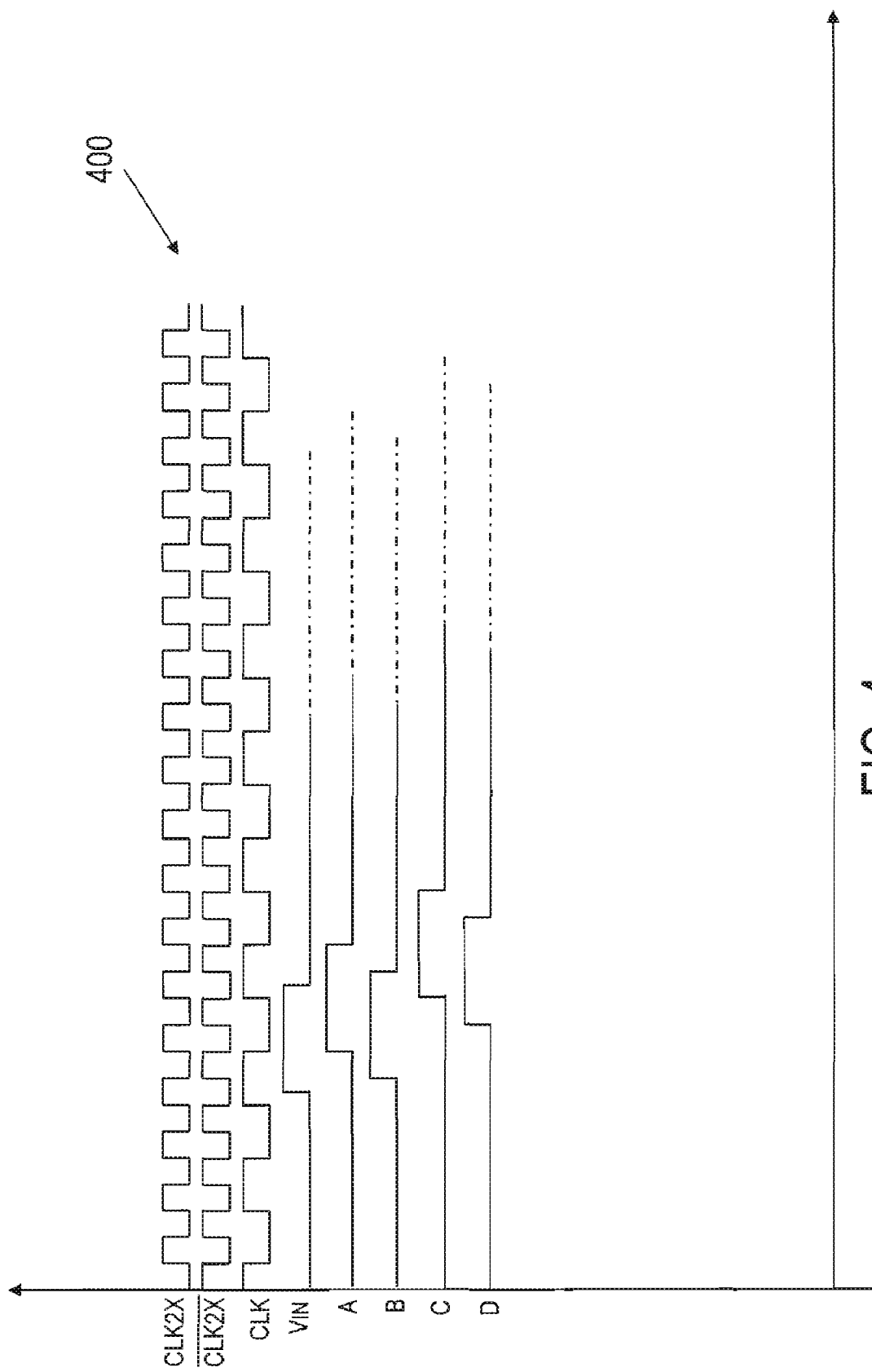
FIG. 4 is a timing diagram illustrating the functionality of the exemplary positive-clock memory circuit and negative-clock memory circuit of FIG. 3.

FIG. 4 is a timing diagram 400 illustrating the functionality of memory circuits 220 and 240 in the context of a generalized system clock CLK, sample clock signals CLK2X and /CLK2X, and an exemplary input/reference pulse ($V_{IN}$). Note that while the exemplary sample clock signals CLK2X and /CLK2X are twice the frequency of system clock CLK, it should be appreciated that a sample clock signal may have even higher frequency than CLK2X with particular advantage found at frequency multiples of system clock CLK. For example, it may be possible that the sample clocks of FIG. 3 be three or four times the frequency of system clock CLK. If the same range of delay is desired, the chain of memory cells for both memory circuits 220 and 240 may be appropriately expanded to form longer shift-delay type memory devices.

Returning to FIG. 4, it should be noted that reference pulse $V_{IN}$ may be a by-product of system clock CLK, and for the particular examples below reference pulse $V_{IN}$ is limited to multiples of the period of system clock CLK for ease of explanation. For example, as may be noted in FIG. 4, the reference pulse of signal $V_{IN}$ is exactly one period of system clock CLK. As timing diagram 400 shows, given the relative position of the reference pulse $V_{IN}$ to the sample clock CLK2X and /CLK2X, positive-clock memory circuit 220 and negative-clock memory circuit 240 may produce four separate delayed versions of reference pulse $V_{IN}$ (signals A, B, C and D) noting that each of these output signals A, B, C and D may be delayed relative to one another by intervals of one half the period of sample clock CLK2X.

Figure 5:
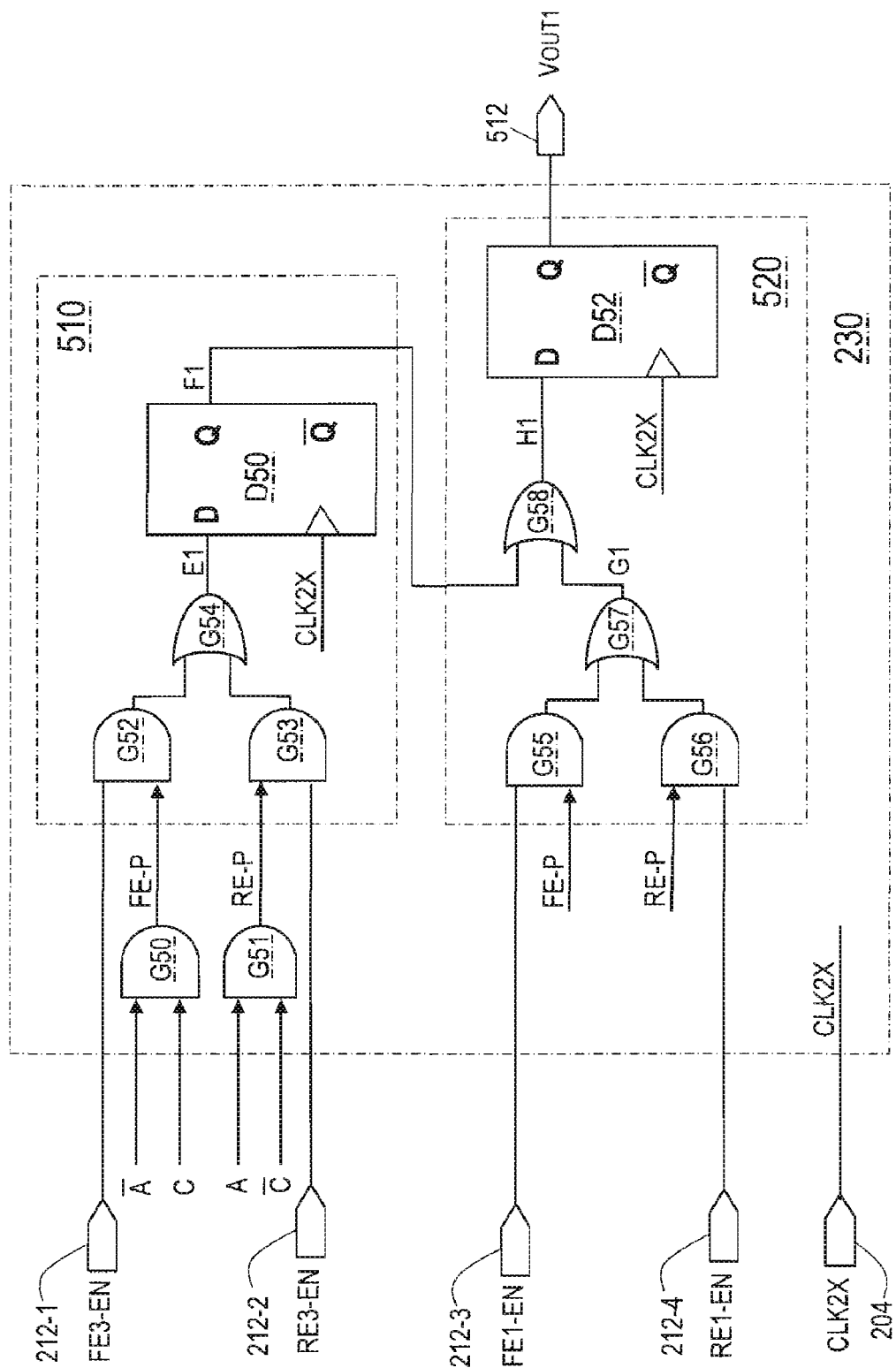
FIG. 5 is a schematic diagram of the exemplary positive-clock logic circuit of FIG. 2.

FIG. 5 is a schematic diagram of an exemplary positive-clock logic circuit 230 of FIG. 2. As shown in FIG. 5, positive-clock logic circuit 230 may include a first logic stage 510 and a second logic stage 520. First logic stage 510 may include a number of logic gates G52-G54 and memory cell D50, while second logic stage 520 may include logic gates G55-G58 and memory cell D52.

In operation, various timing instructions including "falling-edge 3 enable" (FE3-EN), "rising-edge 3 enable" (RE3-EN), "falling-edge 1 enable" (FE1-EN) and "rising-edge 1 enable" (RE1-EN) may be fed to positive-clock logic circuit 230 via their respective nodes 212-1 through 212-4, while memory cells D50 and D52 may store data relative to the rising edge of sample clock CLK2X. As shown in FIG. 5, output signals A and C (and their inverses /A and /C) provided by positive-clock memory circuit 220 may be fed to AND-gates G50 and G51 (which are falling and rising edge detectors, respectively) to provide a falling-edge pulse signal FE-P and a rising-edge pulse signal RE-P. Falling-edge pulse signal FE-P and rising-edge pulse signal RE-P may then be gated or logically combined with falling-edge instruction FE3-EN and rising-edge instruction RE3-EN using AND-gates G52 and G53 respectively. The output of AND-gates G52 and G53 may then be logically OR'ed using OR-gate G54 with the output of OR-gate G54 (node E1) fed to the input of memory cell D50. Gates G52-G54 form a selector that selects FE-P and/or RE-P based on FE3-EN and RE3-EN instructions control signals). In turn, memory cell D50 may provide a delayed version node F1) of the signal at node E1 to OR-gate G58.

Similarly, falling-edge pulse signal FE-P and a rising-edge pulse signal RE-P may also be gated or logically combined with falling-edge instruction FE1-EN and rising-edge instruction RE1-EN using AND-gates G55 and G56, respectively. The respective outputs of AND-gates G55 and G56 may then be logically OR'ed using OR-gate G57 with the output of OR-gate G57 (node G1) fed to OR-gate G58. G55-G57 form another selector that selects FE-P and/or RE-P based on FE1-EN and RE1-EN instructions. As OR-gate G58 receives those signals provided at nodes F1 and G1, OR-gate G58 may feed its output (node H1) to memory cell D52, which may in turn produce output $V_{OUT1}$ 512. D50 and D52 delay signals at nodes E1 and H1, respectively. The signal at E1 is delayed by two CLK2X periods while the signal at node H1 is delayed by one CLK2X period.

Figure 6:
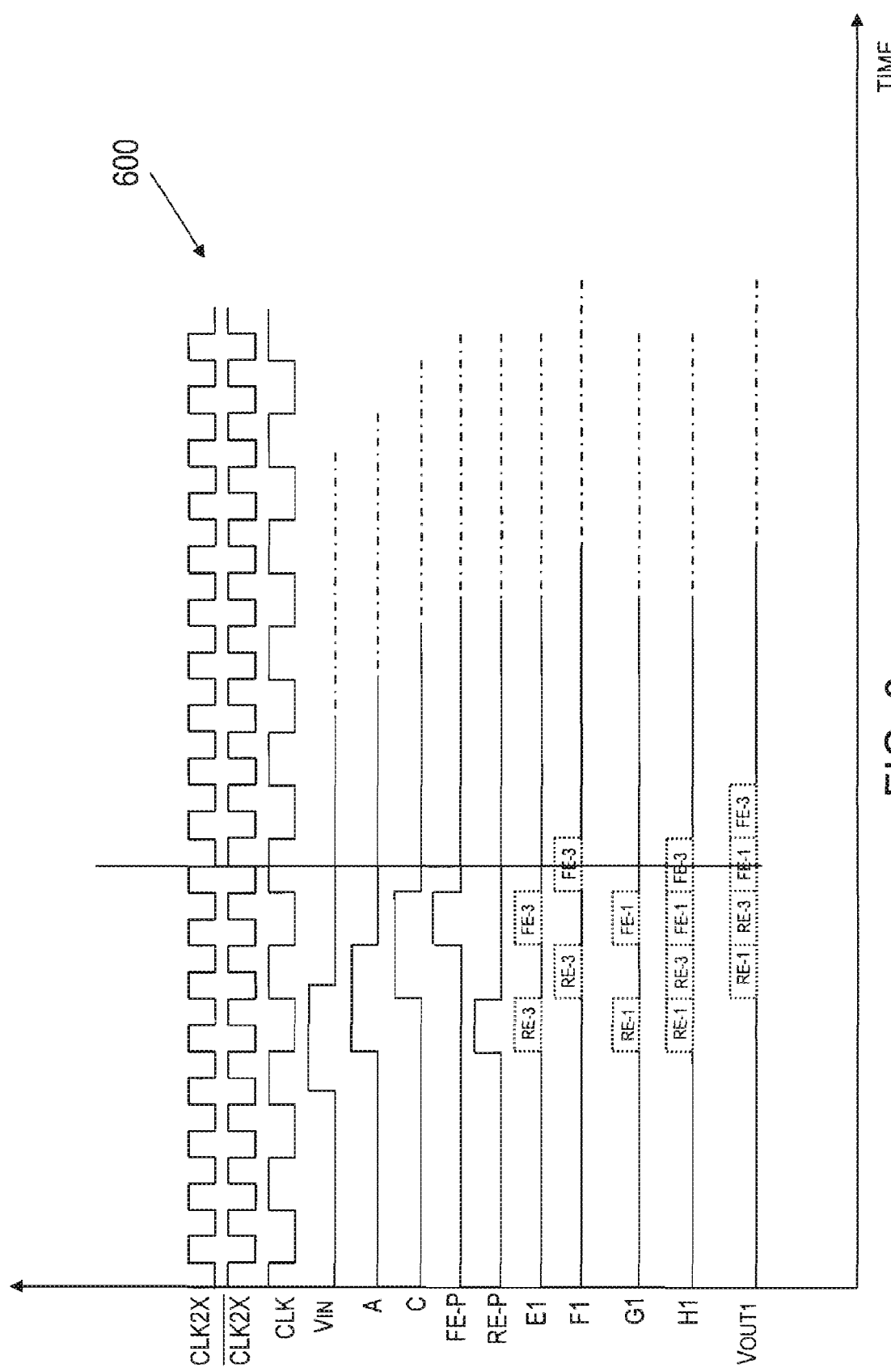
FIG. 6 is a timing diagram illustrating the functionality of the positive-clock logic circuit of FIG. 5.

FIG. 6 is a timing diagram 600 illustrating the functionality of positive-clock logic circuit 230. As with timing diagram 400 of FIG. 4, functionality is displayed in context with system clock CLK, sample clock signals CLK2X and /CLK2X, and reference pulse $V_{IN}$. As shown in FIG. 6, output signals A and C provided by positive-clock memory circuit 220 are also displayed along with their resultant falling-edge pulse signal FE-P and a rising-edge pulse signal RE-P. Note that for the present example, falling-edge pulse signal FE-P and rising-edge pulse signal RE-P are separated by one clock period of sample clock CLK2X. This separation may increase with increasing reference pulse lengths.

Also note that prospective pulses RE-3 and FE-3 at node E1 are contingent upon the respective states of rising-edge instruction RE3-EN and falling-edge instruction FE3-EN. Similarly, prospective pulses RE-1 and FE-1 at node G1 are contingent upon the respective states of rising-edge instruction RE1-EN and falling-edge instruction FE1-EN. For example, should rising-edge instruction RE1-EN be a logical "1" while the remaining instructions RE3-EN, FE1-EN and FE3-EN be a logical "0," then pulse RE-1 will appear at node G1 and propagate to node H1 and $V_{OUT1}$ while prospective pulses RE-3, FE-1 and FE-3 will not.

While in theory as many as four pulses/pulse segments may be generated at $V_{OUT1}$, it should be appreciated that only one rising-edge instruction RE1-EN or RE3-EN, and only one falling-edge instruction FE1-EN or FE3-EN, should be active at any given time such that output $V_{OUT1}$ may contain two pulses/pulse segments. Additionally, only one rising edge instruction and falling-edge instruction may be activated for the combination of positive-clock logic circuit 230 and negative-clock logic circuit 250 such that only one of RE-0, RE-1, RE-2 and RE-3 will be generated, and only one of FE-0, FE-1, FE-2 and FE-3 will be generated. Note that for the purposes of this disclosure, any prospective pulse RE-0, RE-1, RE-2, RE-3, FE-0, FE-1, FE-2 and FE-3 that is appropriately enabled by a respective timing instruction and that propagates to at least one of nodes $V_{OUT}$ and $V_{OUT2}$ will be referred to as a "marking pulse." Accordingly, assuming that instructions RE1-EN and FE2-EN are active, pulses RE-1 and FE-2 may be referred to as the rising-edge "marking pulse" and the falling-edge "marking pulse," respectively.

Figure 7:
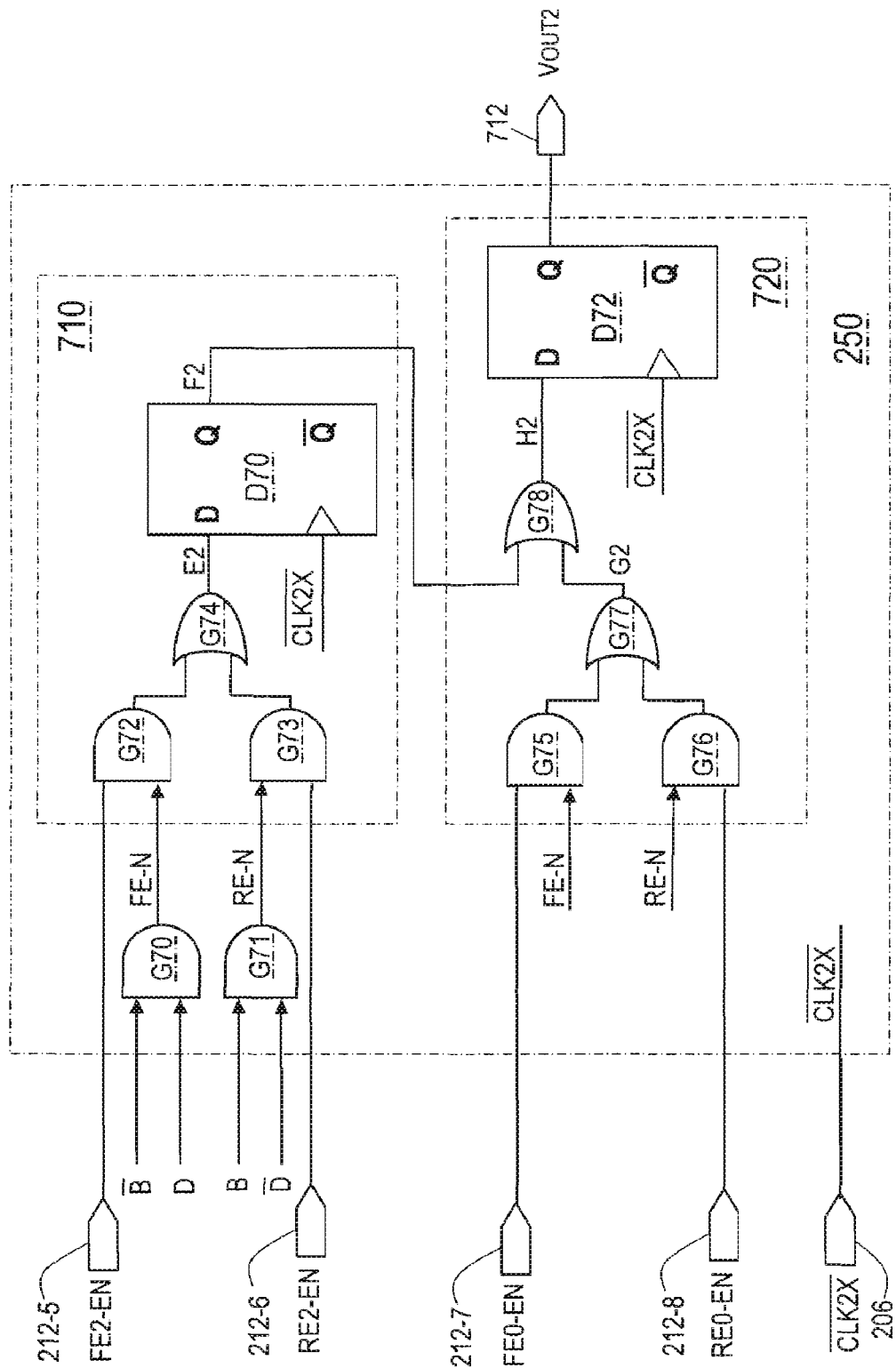
FIG. 7 is a schematic diagram of the exemplary negative-clock logic circuit of FIG. 2.

FIG. 7 is a schematic diagram of an exemplary negative-clock logic circuit 250 of FIG. 2. As shown in FIG. 7, negative-clock logic circuit 250 may include a first logic stage 710 and a second logic stage 720. First logic stage 710 may include a number of logic gates G72-G74 and memory cell D70, while second logic stage 720 may include logic gates G75-G78 and memory cell D72. Similar to the positive-clock logic circuit 230, AND gates G70 and G71 are falling and rising edge detectors and gates G72-G74 and G75-G77 form selectors. D70 and D72 provide delays based on /CLK2X.

As the example structure of negative-clock logic circuit 250 is identical to the example structure of positive-clock logic circuit 230, operational details will be omitted with the exception that negative-clock logic circuit 250 operates using sample clock /CLK2X, timing instructions FE2-EN, RE2-EN, FE0-EN and RE0-EN, and output signals B and D (and their inverses) provided by negative-clock logic circuit 240.

Figure 8:
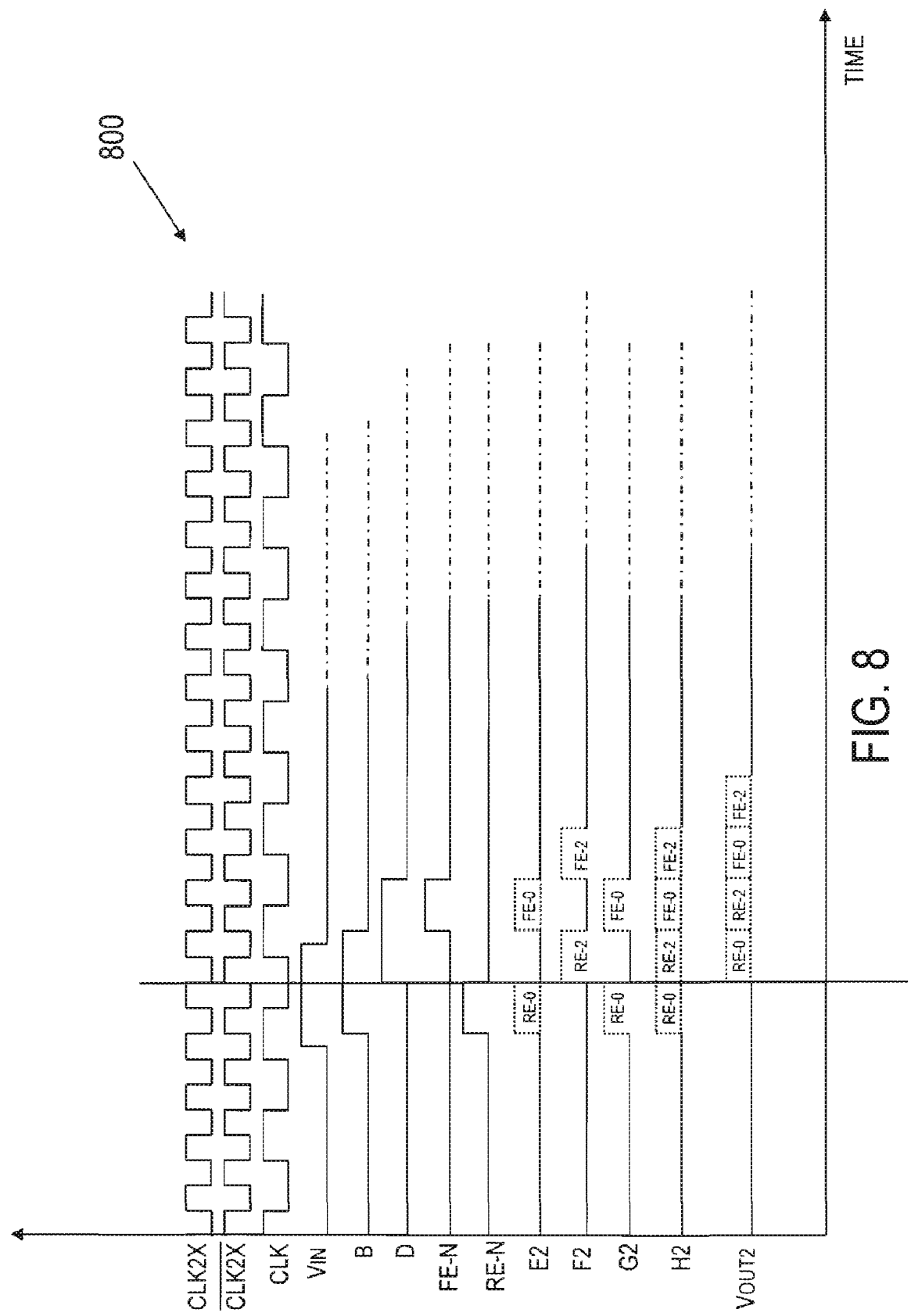
FIG. 8 is a timing diagram illustrating the functionality of the exemplary negative-clock logic circuit of FIG. 6.

FIG. 8 is a timing diagram 800 illustrating the functionality of an exemplary negative-clock logic circuit 250. As with timing diagram 400 of FIG. 4 and diagram 600 of FIG. 6, functionality is displayed in context with system clock CLK, sample clock signals CLK2X and /CLK2X, and reference pulse $V_{IN}$.

Again, given the similarity of positive-clock logic circuit 230 and negative-clock logic circuit 250, details about the various signals FE-N, RE-N, E2, F2, G2, H2 and $V_{OUT2}$ 712 will be omitted for brevity with the exception that they may appear one-half period of sample clock CLK2X ahead of their counterparts FE-P, RE-P, E1, F1, G1, F1 and $V_{OUT1}$ of FIG. 6.

Figure 9:
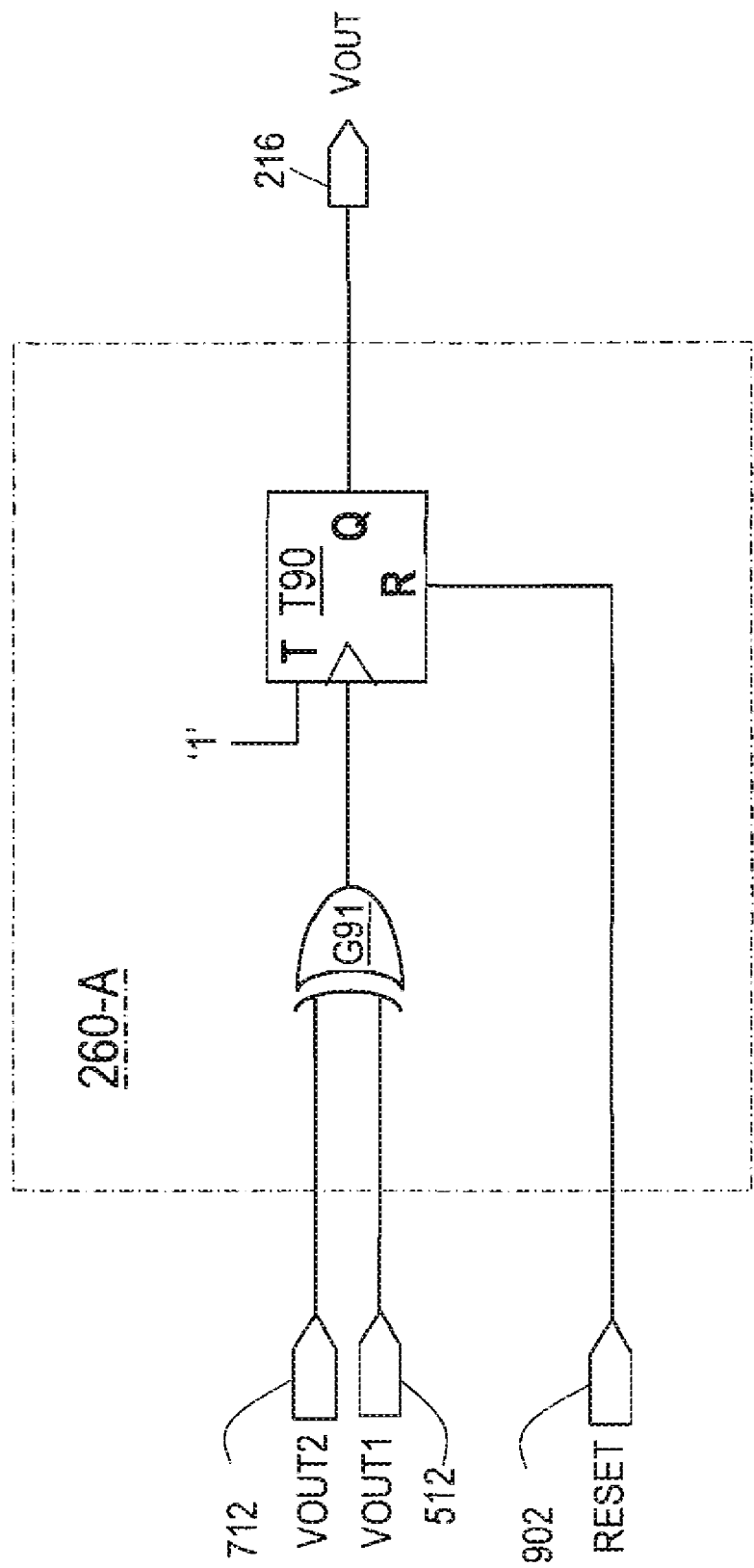
FIG. 9 is a first exemplary embodiment of the output logic circuit of FIG. 2.

Continuing to FIG. 9, a first exemplary embodiment of output logic circuit 260-A which is an output synthesizer is shown. As shown in FIG. 9, output logic circuit 260-A may include an exclusive-OR (XOR)-gate G91 feeding into the input of memory cell T90 configured as a toggle flip-flop with RESET 902 feeding into a reset node of memory cell T90. A "T" input may be added to tie the T input to be a logical '1', which causes the T flip-flop to toggle on every rising edge of the clock input. A toggle flip-flop may be implemented in many ways. For example, a D-flip-flop with negative Q-output connected to the D-input may be used as toggle flip-flop where the clock input corresponds to the "T" input.

While a system RESET signal may be used to provide an appropriate reset function, it should be appreciated that any number of other signals may also be used as may be appropriate, advantageous or available. Further, while gate G91 is depicted as an exclusive-OR gate, in various other embodiments it should be appreciated that an OR-gate may alternatively be provided. While exemplary output logic circuit 260-A may be perfectly functional for most applications, it should be appreciated that for three particular combinations of rising and falling-edge instructions, output logic circuit 260-A may not provide an appropriate output. However, as there may be many systems where these three particular instances will never occur, the example output logic circuit 260-A of FIG. 9 may provide a simple yet very useful output circuit.

Figure 10:
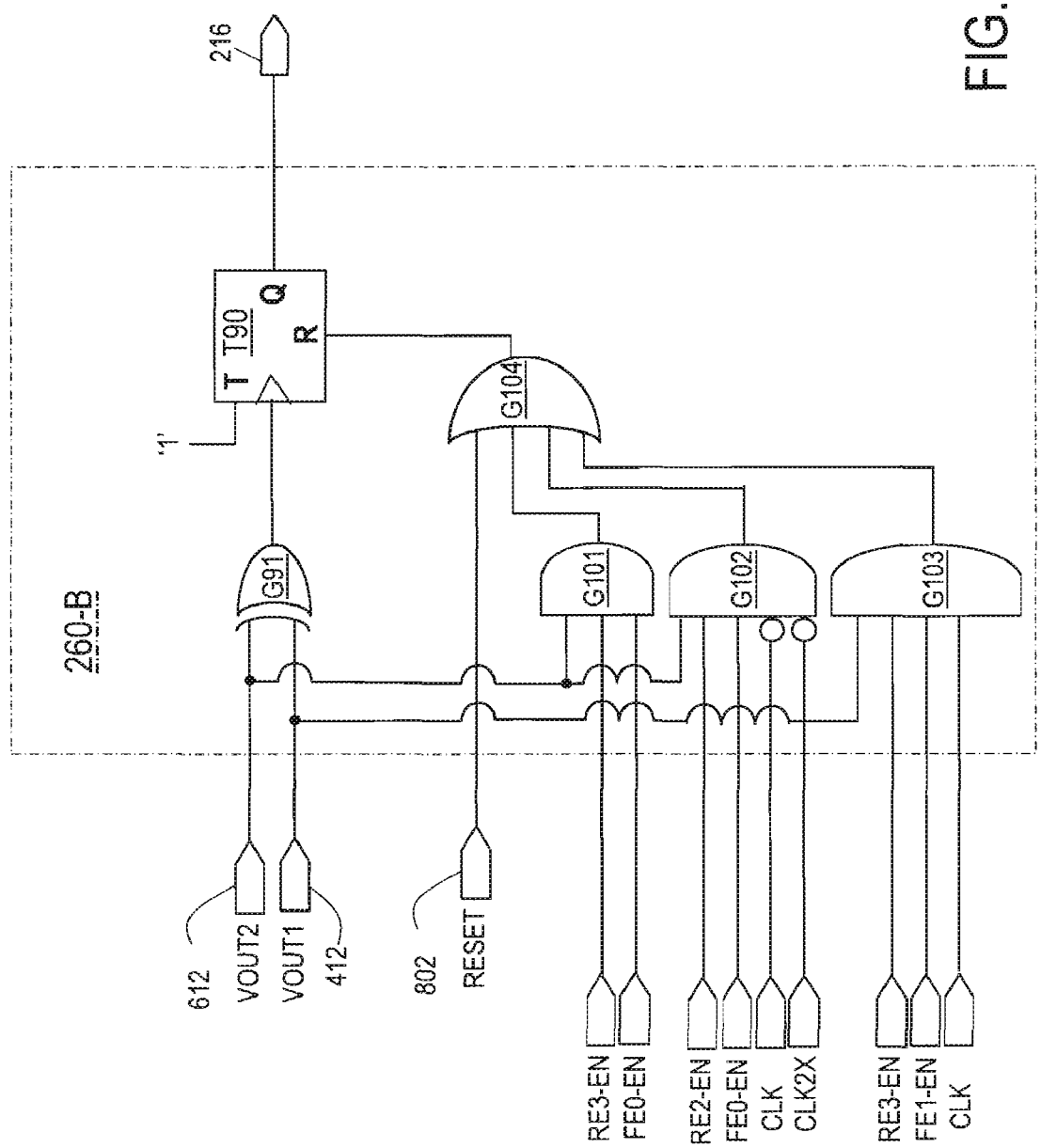
FIG. 10 is a second exemplary embodiment of the output logic circuit of FIG. 2.

Continuing to FIG. 10, a second exemplary embodiment of output logic circuit 260-B (another output synthesizer) having input gate G91, memory cell T90 and reset logic gates G101-G104 is provided. As will be shown below with respect to timing diagrams of FIGS. 11 and 12, the second exemplary output logic circuit 260-B may be used for all 16 combinations of rising and falling edges, Not that exemplary output logic circuits 260-A and 260-B are but two examples of possible output circuits, and that other useful output circuits may be used with or without any possible updates to positive-clock logic circuit 230 and negative-clock logic circuit 250.

Figure 11:
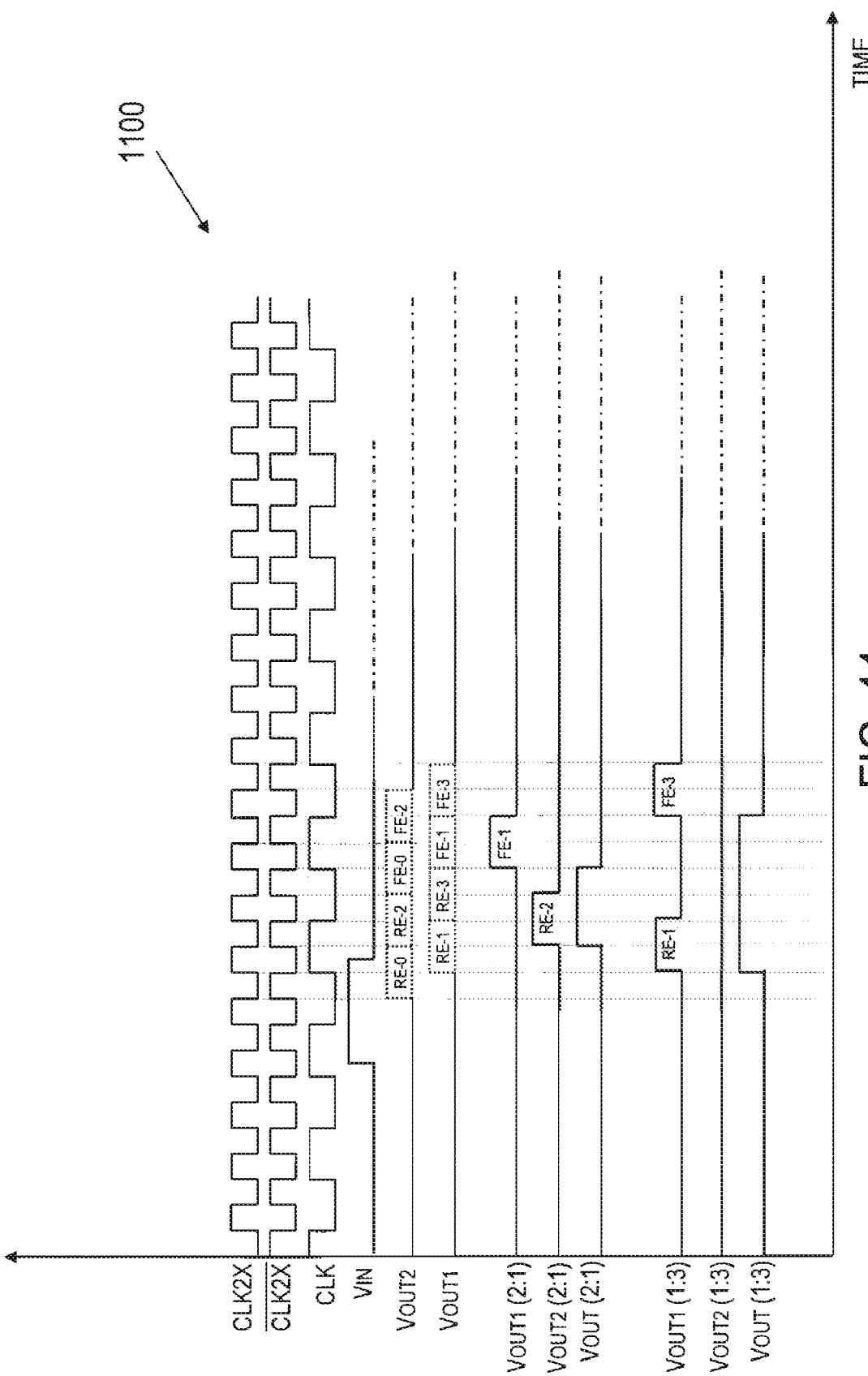
FIG. 11 is a timing diagram illustrating the functionality of the output logic circuit of FIGS. 9 and 10.

FIG. 11 shows an exemplary timing diagram 1100 with two examples of a reference pulse $V_{IN}$ producing an output pulse $V_{OUT}$ having adjusted rising and falling edges. The first example of FIG. 11 ($V_{OUT}$(2:1)) is shown where the rising-edge instruction RE2-EN (of FIG. 7) and the falling-edge instruction FE1-EN (of FIG. 5) are activated to produce rising-edge marking pulse RE-2 on $V_{OUT2}$ and falling-edge marking pulse FE-1 on $V_{OUT1}$. As can be seen in output signal $V_{OUT}$, the rising edge of rising-edge marking pulse RE-2 may cause output pulse $V_{OUT}$ to rise while the rising edge of falling-edge marking pulse FE-1 may cause output pulse $V_{OUT}$ to fall.

Continuing to the second example of FIG. 11 ($V_{OUT}$(3:1)), rising-edge instruction RE1-EN and falling-edge instruction FE3-EN (both of FIG. 5) are activated to produce rising-edge marking pulse RE-1 and falling-edge marking pulse FE-3 on output signal $V_{OUT1}$. In response, output signal $V_{OUT}$ may have a rising edge determined by rising-edge marking pulse RE-1 and a falling edge determined by falling-edge marking pulse FE-3.

Figure 12:
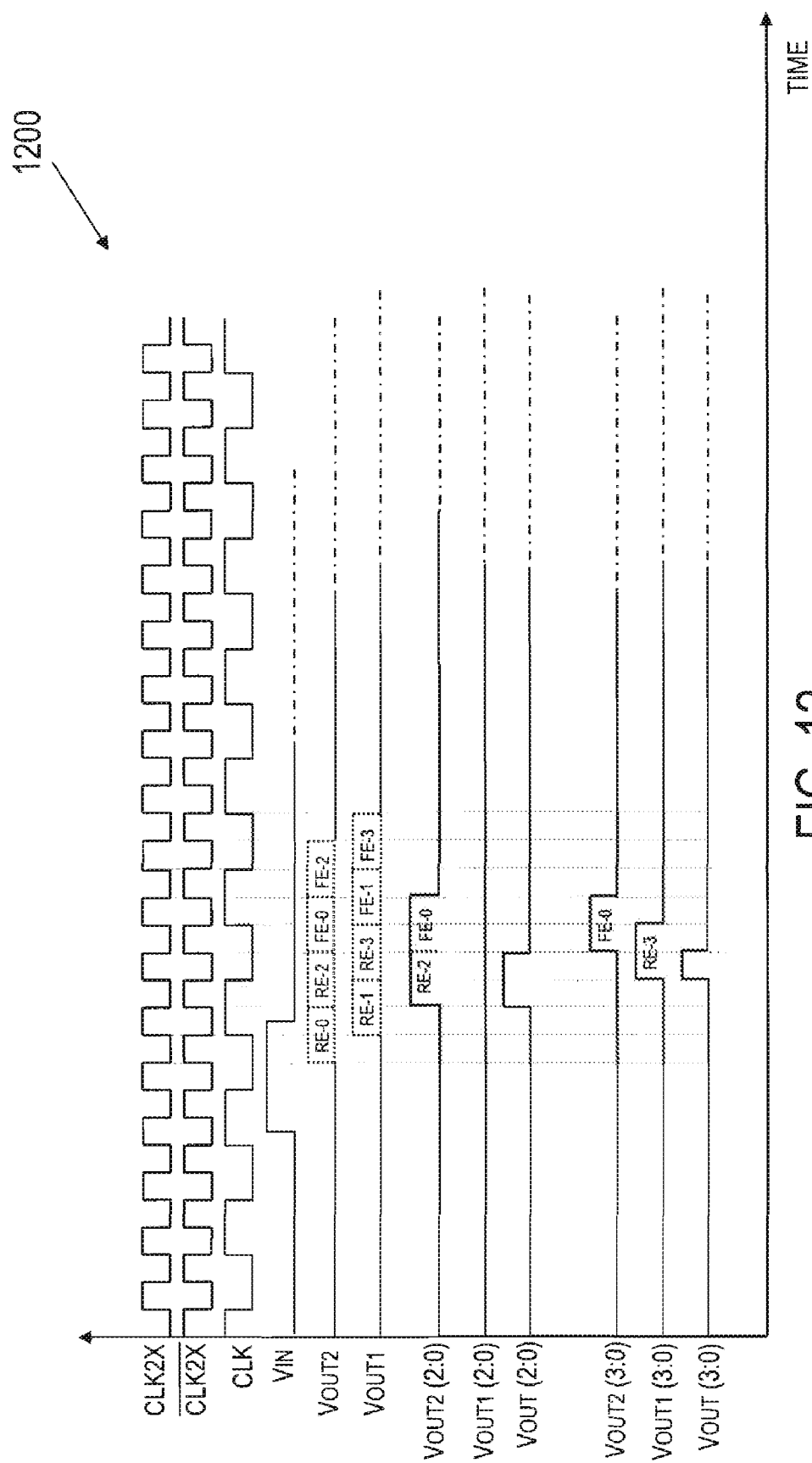
FIG. 12 is a timing diagram illustrating the functionality of the output logic circuit of FIG. 10.

FIG. 12 shows an exemplary timing diagram 1200 with two examples of marking pulse combinations that may be appropriately manipulated by output logic circuit 260-B, but not by output logic circuit 260-A, are shown. As shown in FIG. 12, the first example ($V_{OUT}$(2:0)) is one where rising-edge instruction RE2-EN and falling-edge instruction FE0-EN of FIG. 7 are enabled. This may result in two abutting marking pulses RE-2 and FE-0 on output signal $V_{OUT2}$, which in turn may be used to generate output signal $V_{OUT}$. As marking pulses RE-2 and FE-0 may form a single elongated pulse, any logical OR'ing or XOR'ing may be insufficient to produce two distinct rising edges to cause output signal $V_{OUT}$ to both rise and fall. Thus, memory cell T90 is reset by AND gate G102 when falling-edge instruction FE0-EN becomes 1 while $V_{OUT2}$, rising-edge instruction RE2-EN, /CLK and /CLK2X are 1's. In this way, memory cell T90 outputs the output signal having a correct pulse length.

The second example provided in FIG. 12 ($V_{OUT}$(3:0)) is one where rising-edge instruction RE3-EN of FIG. 5 and falling-edge instruction FE0-EN of FIG. 7 are enabled to produce rising-edge marking pulse RE-3 on output signal $V_{OUT1}$ 512 and falling-edge marking pulse FE-0 on output signal $V_{OUT2}$, which in turn can be used to generate output pulse $V_{OUT}$. Note that, while XOR'ing $V_{OUT1}$ and $V_{OUT2}$ will produce two distinct pulses to cause $V_{OUT}$ to both rise and fall, the second pulse of the logical XOR'ing may be delayed one-half clock cycle of sample clock CLK2X. Thus, memory cell T90 is reset by AND gate G101 when rising-edge instruction RE3-EN becomes 1 while $V_{OUT2}$ and rising-edge instruction RE3-EN are 1's. In this way, memory cell T90 outputs the output signal having a correct pulse length. Similarly, although not described, AND gate G103 also forces a reset of memory cell T90 at the correct time.

Figure 13:
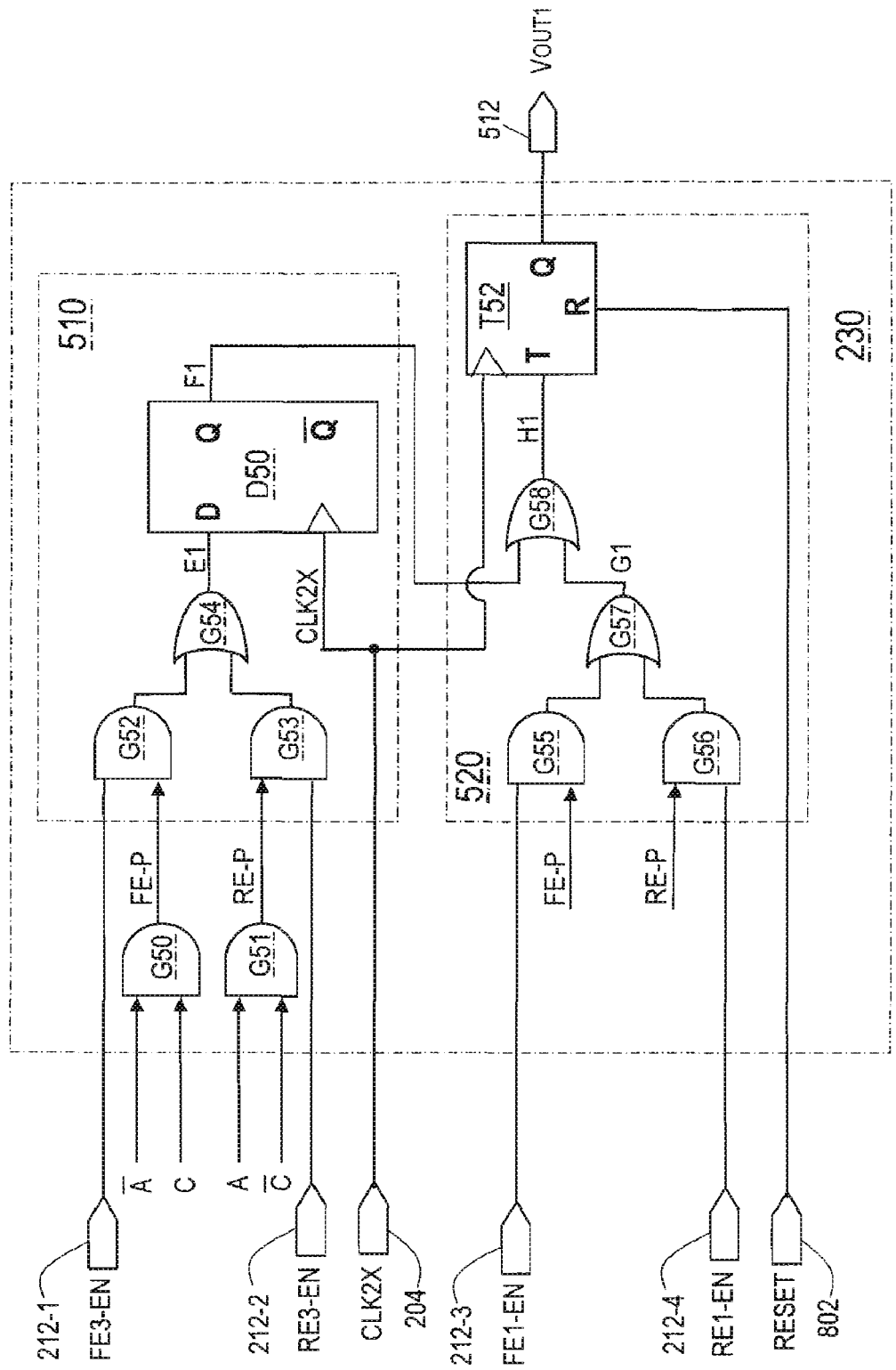
FIG. 13-15 are schematic diagrams of alternative exemplary positive and negative clock logic circuits and output logic corresponding to FIGS. 5, 7 and 9.
Figure 14:
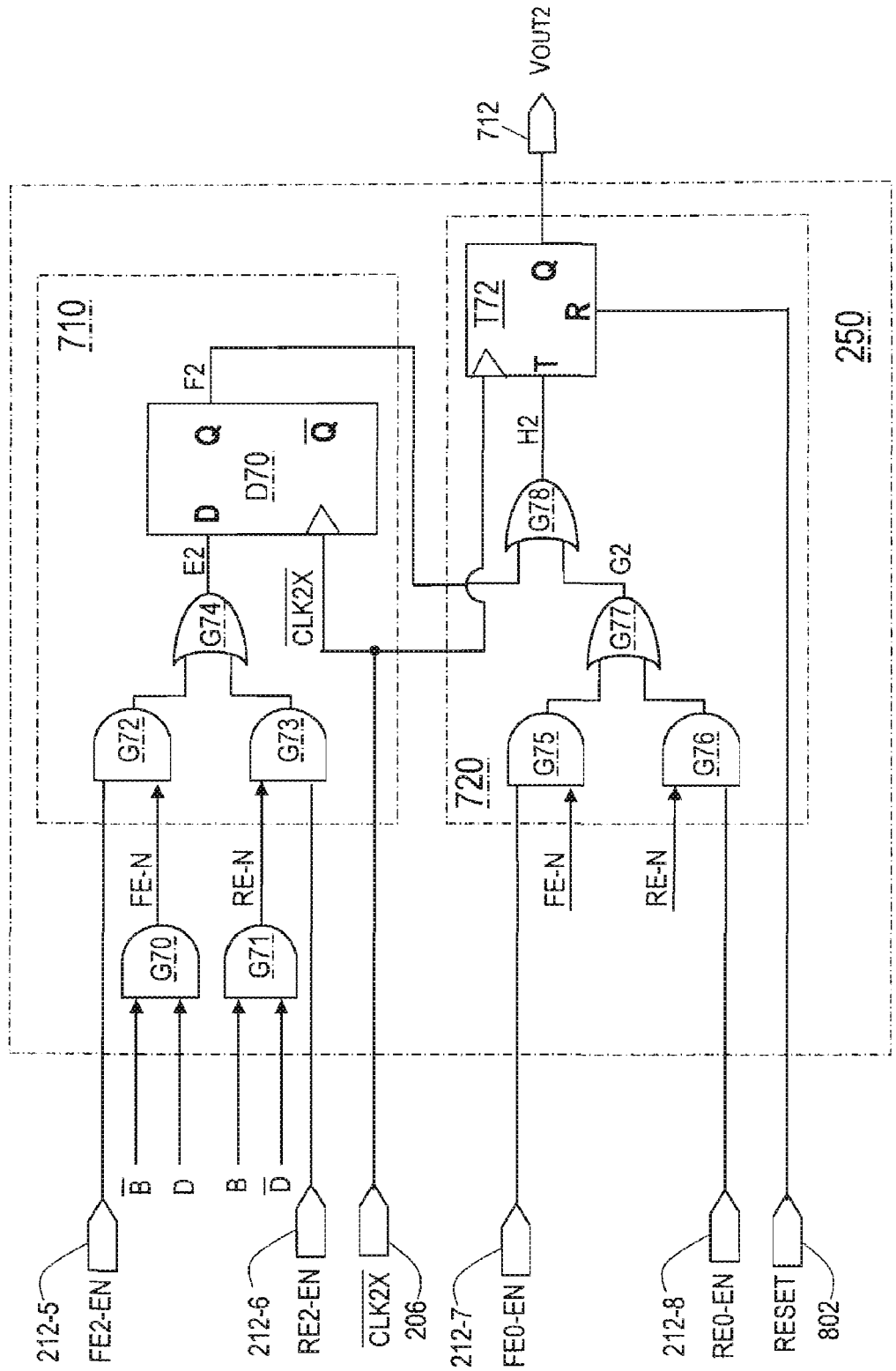

FIGS. 13 and 14 show schematic diagrams that correspond to that shown in FIGS. 5 and 7. The only differences are that instead of D-flip-flops D52 and D72, these memory cells are T-flip-flops T52 and T72. T52 changes state at rising edges of RE-1, RE3, FE-1 and FE3, and T72 changes state at rising edges of RE-0, RE-2, FE-0 and FE-2. Thus, assuming that $V_{OUT1}$ 512 and $V_{OUT2}$ 712 begin at a same state value (Hi or Low), then the transitions shown in the following table may occur:

TABLE

| Rising Edge | Falling Edge | $V_{OUT1}$ | $V_{OUT2}$ |
|---|---|---|---|
| RE-0, 2 | FE-0, 2 | Constant (Hi or Low) | Pulse (Positive or Negative) |
| RE-0, 2 | FE-1, 3 | Step (Hi-to-Low or Low-to-Hi) | Step (Hi-to-Low or Low-to-Hi) |

TABLE-continued

| Rising Edge | Falling Edge | $V_{OUT1}$ | $V_{OUT2}$ |
|---|---|---|---|
| RE-1, 3 | FE-0, 2 | Step (Hi-to-Low or Low-to-Hi) | Step (Hi-to-Low or Low-to-Hi) |
| RE-1, 3 | FE-1, 3 | Pulse (Positive or Negative) | Constant (Hi or Low) |

Figure 15:
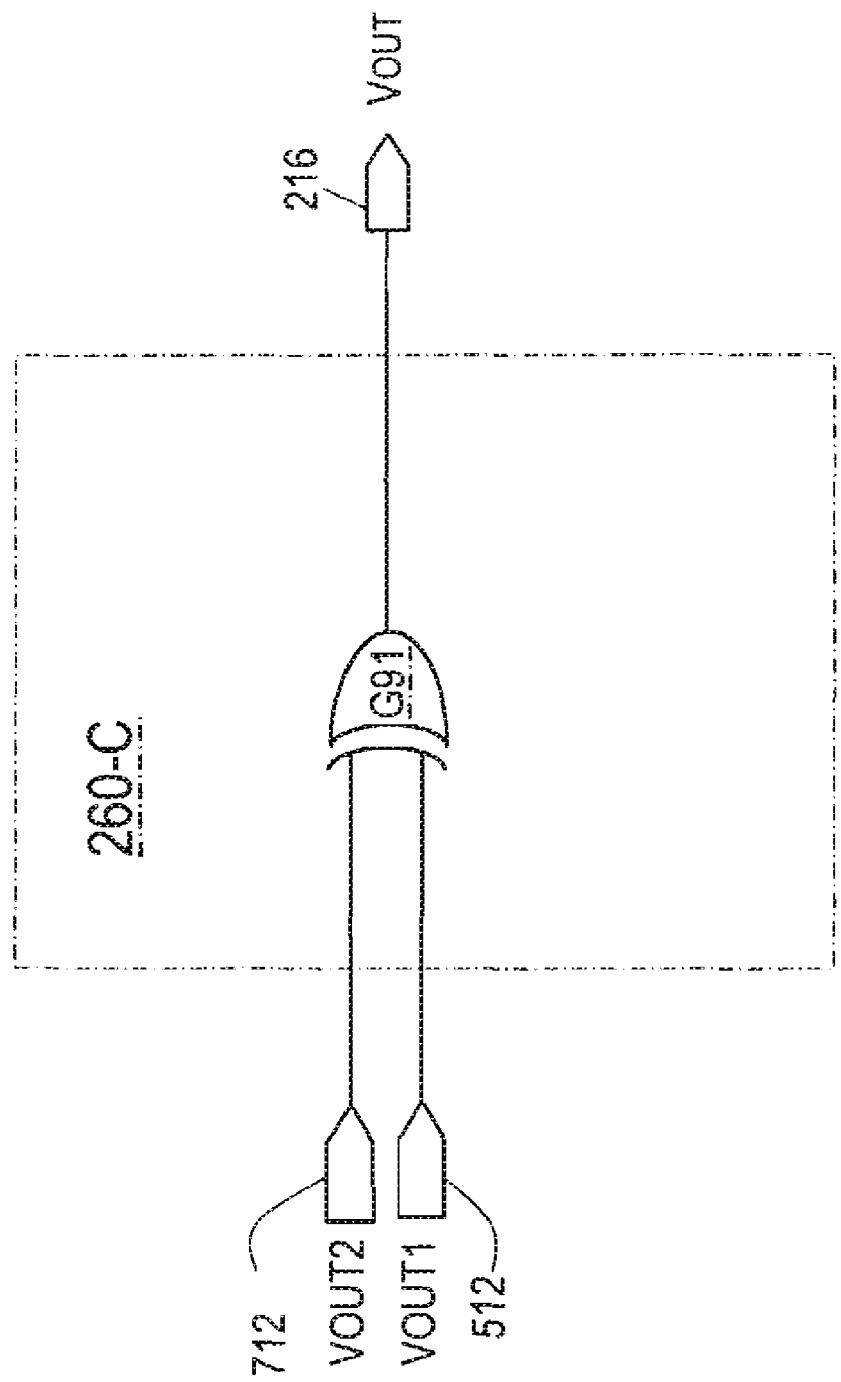

Thus, after a complete operation, $V_{OUT1}$ and $V_{OUT2}$ will be at a same state, and a difference in the states between $V_{OUT1}$ in and $V_{OUT2}$ indicates the timing of the output rising and falling edge adjusted signal. Accordingly, as shown in FIG. 15, an output circuit 260-C that combines $V_{OUT1}$ 512 and $V_{OUT2}$ 712 to form $V_{OUT}$ 216 is only exclusive-OR gate G91 without the need for memory cell T90 that is shown in FIGS. 9 and 10. Advantageously, during testing of this circuit, the flip-flops clock inputs may be directly manipulated without the need for further consideration given to intervening combinational clock logic, therefore avoiding the variable delays and glitches associated with the use of combinational logic.

Figure 16:
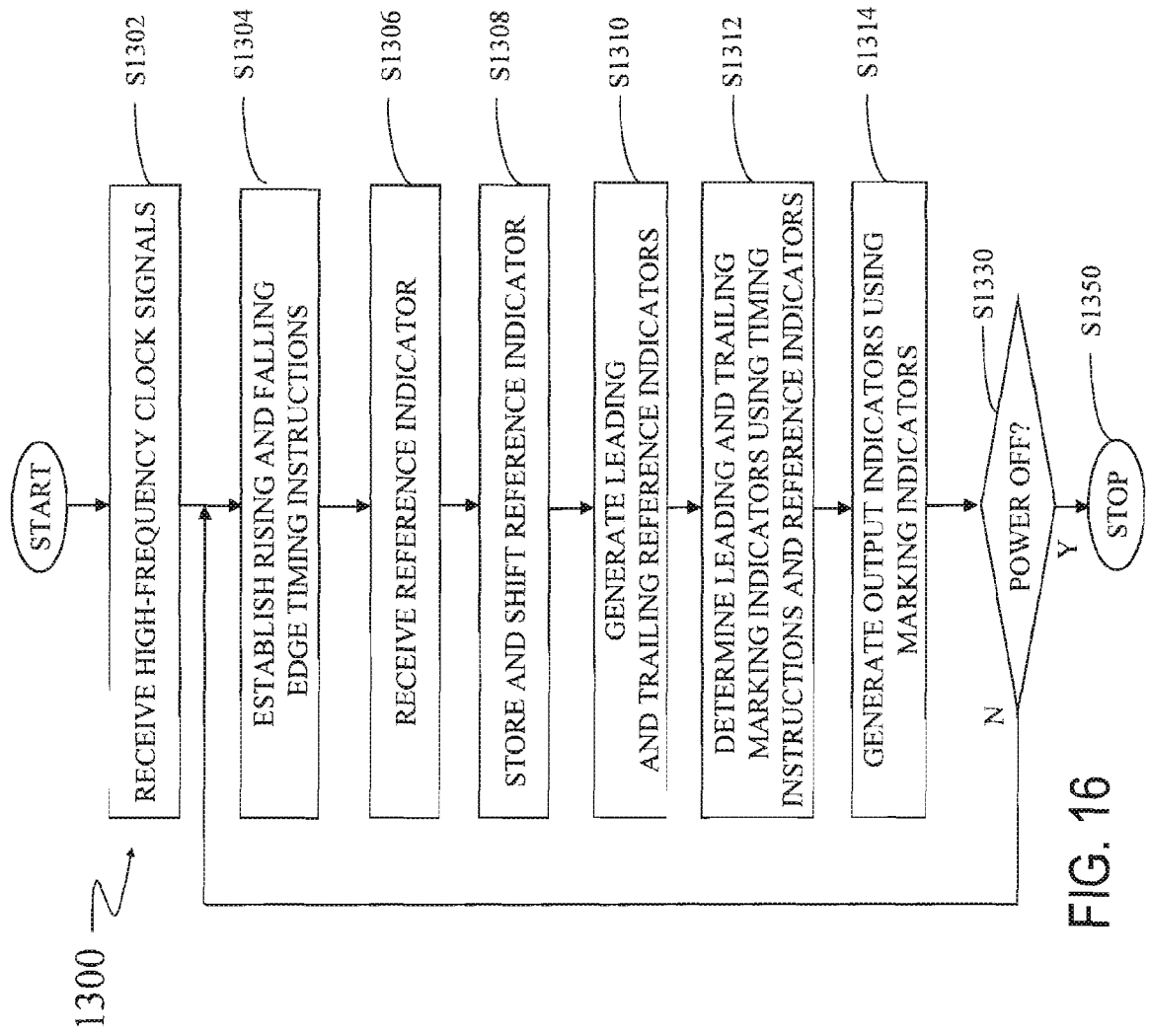
FIG. 16 is a flowchart outlining an exemplary process for adapting leading and trailing edges of pulses.

FIG. 16 is a flowchart 1300 outlining an exemplary operation for generating an output indicator having adjustable rising and falling edges, and wherein an indicator can include pulses and transitions. The process starts in step S1302 where one or more high-speed sample clocks, such as clocks CLK2X and /CLK2X discussed above, can be received, and control goes to step S1304. In step S1304, a set of rising and falling-edge instructions are established, such as any of the rising and falling-edge instructions RE0-EN, RE1-EN, RE2-EN, RE3-EN, FE0-EN, FE1-EN, FE2-EN and FE3-EN of FIGS. 5 and 7, and control goes to step S1306. In step S1306, a reference/input indicator may be received, and control goes to step S1308.

In step S1308, the reference/input indicator may be stored and effectively shifted/delayed using positive-clock memory circuit 220 and negative-clock memory circuit 240 or otherwise shifted using an equivalent or functionally similar device, and control goes to step S1310. In step S1310, a number of leading and trailing edge indicators, such as the rising-edge indicator signal RE-P and falling-edge indicator signal FE-P of FIG. 5 and rising-edge indicator signal RE-N and falling-edge indicator signal FE-N of FIG. 7, may be generated using output signals generated from step S1308, and control goes to step S1312.

In step S1312, a leading marking indicator and a trailing marking indicator may then be determined based on the indicators of step S1310 and the timing instructions of step S1302, and control goes to step S1314. In step S1314, an output indicator may be generated using the rising-edges of the marking indicators of step S1310, and control goes to step S1330.

In step S1330, a determination is made as to whether to turn system power off. If system power is to be turned off, control goes to step S1350 where the process stops; otherwise, control returns to step S1304 where the rising and falling edge timing instructions may be changed to affect the output without requiring a system power to be turned off, thereafter, another reference indicator may be received and subsequently processed.

While the disclosed methods and systems have been described in conjunction with exemplary embodiments, these embodiments should be viewed as illustrative, not limiting. Various modifications, substitutes, or the like are possible within the spirit and scope of the disclosed methods and systems.

What is claimed is:

1. A device for adjusting a timing of at least one edge of an output pulse created in response to a reference pulse, the device comprising:
   a first memory circuit including two or more first memory cells and configured to periodically sample the reference pulse at rising edges of a first sample clock to generate positive sample output signals, the first memory circuit providing first sample output signals for each first memory cell;
   a second memory circuit including two or more second memory cells and configured to periodically sample the reference pulse at falling edges of the first sample clock to generate negative sample output signals, the second memory circuit providing second sample output signals for each second memory cell; and
   a combinatorial logic circuit configured to produce the output pulse having at least one adjusted edge based on a set of timing instructions generated from a control node and at least one of the positive sample output signals and the negative sample output signals, wherein the control node feeds the set of timing instructions to a clock logic circuit that is coupled with one of the first and second memory circuits.

2. The device of claim 1, wherein the two or more first memory cells are arranged in a series shifting configuration, and wherein the two or more second memory cells are arranged in a series shifting configuration.

3. The device of claim 2, wherein the two or more second memory cells are configured to sample the reference pulse in response to the rising edges of a second sample clock, the second sample clock being an inverted version of the first sample clock.

4. The device of claim 2, wherein each of the two or more first and second memory cells is an edge-triggered flip-flop.

5. The device of claim 1, wherein the combinatorial logic circuit includes a first logic circuit connected to a first positive memory cell.

6. The device of claim 5, wherein the first logic circuit includes a first gate for gating a first rising-edge timing instruction of the set of timing instructions with at least two of the first sample output signals.

7. The device of claim 6, wherein the first logic circuit further includes a second gate for gating a first falling-edge timing instruction of the set of timing instructions with at least two of the first sample output signals.

8. The device of claim 7, wherein the first logic circuit further includes a third gate for logically combining output signals of the first and second gates to generate a first resultant output signal, wherein the first resultant output signal is input to the first positive memory cell.

9. The device of claim 5, wherein the combinatorial logic circuit further includes a second logic circuit coupled to one or more outputs of the first logic circuit, the second logic circuit connected to a second positive memory cell.

10. The device of claim 9, wherein the second logic circuit includes a fourth gate for gating a second rising-edge timing instruction of the set of timing instructions with at least two of the first sample output signals.

11. The device of claim 10, wherein the second logic circuit further includes a fifth gate for gating a second falling-edge timing instruction of the set of timing instructions with at least two of the first sample output signals.

12. The device of claim 10, wherein the second logic circuit further includes a sixth gate for logically combining output signals of the fourth and fifth gates to generate a second resultant output signal, wherein the second resultant output signal is input to the second positive memory cell.

13. The device of claim 12, wherein the second positive memory cell also receives an output of the first positive memory cell.

14. The device of claim 11, wherein the first positive memory cell and the second positive memory cell store data at the rising edges of the first sample clock.

15. The device of claim 9, wherein the combinatorial logic circuit further includes a third logic circuit connected to a first negative memory cell.

16. The device of claim 15, wherein the third logic circuit includes a seventh gate for gating a third rising-edge timing instruction of the set of timing instructions with at least two of the second sample output signals.

17. The device of claim 16, wherein the third logic circuit further includes an eighth gate for gating a third falling-edge timing instruction of the set of timing instructions with at least two of the second sample output signals.

18. The device of claim 17, wherein the third logic circuit further includes a ninth gate for logically combining output signals of the seventh and eighth gates to generate a third resultant output signal, wherein the third resultant output signal is input to the first negative memory cell.

19. The device of claim 15, wherein the combinatorial logic circuit further includes a fourth logic circuit coupled to one or more outputs of the third logic circuit, the fourth logic circuit connected to a second negative memory cell.

20. The device of claim 19, wherein the fourth logic circuit includes a tenth gate for gating a fourth rising-edge timing instruction of the set of timing instructions with at least two of the second sample output signals.

21. The device of claim 20, wherein the fourth logic circuit further includes an eleventh gate for gating a fourth falling-edge timing instruction of the set of timing instructions with at least two of the second sample output signals.

22. The device of claim 21, wherein the fourth logic circuit further includes a twelfth gate for logically combining output signals of the tenth and eleventh gates to generate a fourth resultant output signal, wherein the fourth resultant output signal is input to the second negative memory cell.

23. The device of claim 22, wherein the second negative memory cell also receives an output of the first negative memory cell.

24. The device of claim 23, wherein the first negative memory cell and the second negative memory cell store data at the falling edges of the first sample clock.

25. The device of claim 19, further comprising an output logic circuit containing at least one logic gate and configured to logically combine an output of the first logic circuit and an output of the second logic circuit to produce the output pulse.

26. The device of claim 25, wherein the output logic circuit further includes a first output memory cell.

27. The device of claim 26, wherein the combinatorial logic circuit is configured to produce the output pulse while programmably controlling both a rising edge and a falling edge of the output pulse to a resolution of one-half a period of the first sample clock.

28. A multifunction printing system incorporating the device of claim 1.

29. A method for adjusting a timing of at least one edge of an output pulse created in response to a reference pulse, the method comprising:
sampling the reference pulse at rising edges of a first sample clock signal generated from a first sample clock to generate positive sample output signals;
sampling the reference pulse at falling edges of the first sample clock signal to generate negative sample output signals, generating a set of timing instructions from a control node; and
generating the output pulse that has at least one adjusted edge using digital logic based on the set of timing instructions and at least one of the positive and negative sample output signals, wherein the control node feeds the set of timing instructions to a clock logic circuit that is coupled with a memory circuit.

30. The method of claim 29, wherein the digital logic includes at least two sets of two memory cells arranged in a series shifting configuration.

31. The method of claim 29, further comprising sampling the reference pulse at rising edges of a second sample clock signal, the second sample clock signal being an inverted version of the first sample clock signal, wherein the negative sample output signals are generated based on sampling the reference pulse using the second sample clock signal.

32. The method of claim 29, wherein the steps of sampling includes producing a first set of reference samples based on samples acquired at the rising edges of the sample clock, and producing a second set of reference samples based on samples acquired at the falling edges of the sample clock.

33. The method of claim 32, further comprising generating a first pair of pulses based on the first set of reference samples, the first pair of pulses including a first rising-edge reference pulse and a first falling-edge reference pulse.

34. The method of claim 33, further comprising generating a second pair of pulses based on the second set of reference samples, the second pair of pulses including a second rising-edge reference pulse and a second falling-edge reference pulse.

35. The method of claim 34, further comprising generating a rising-edge marking pulse based on at least one of the first rising-edge reference pulse and the second rising-edge reference pulse.

36. The method of claim 35, further comprising generating a falling-edge marking pulse based on at least one of the first falling-edge reference pulse and the second falling-edge reference pulse.

37. The method of claim 36, wherein the step of generating the output pulse includes at least one of causing the output pulse to rise at a leading edge of the rising-edge marking pulse and causing the output pulse to fall at a leading edge of the falling-edge marking pulse.

38. The method of claim 29, further comprising:
generating a first partial output signal based on the positive sample output signals and edge timing instructions;
generating a second partial output signal based on the negative sample output signals and the edge timing instructions; and
generating the output signals based on the first and second partial output signals.

39. The method of claim 38, wherein the positive sample output signals include a first pair of positive sample signals and a second pair of positive sample signals, the method further comprising:
first logically combining a first rising-edge timing instruction with the first pair of positive sample signals to generate a first rising-edge gated timing instruction;
second logically combining a first falling-edge timing instruction with the second pair of positive sample signals to generate a first falling-edge gated timing instruction; and third logically combining the first rising-edge gated timing instruction and the first falling-edge gated timing instruction to generate a first output edge control signal.

40. The method of claim 39, further comprising:
fourth logically combining a second rising-edge timing instruction with the first pair of positive sample signals to generate a second rising-edge gated timing instruction;
fifth logically combining a second falling-edge timing instruction with the second pair of positive sample signals to generate a second falling-edge gated timing instruction; and
sixth logically combining the second rising-edge gated timing instruction and the second falling-edge gated timing instruction to generate a second output edge control signal.

41. The method of claim 40, further comprising:
delaying the first output edge control signal to generate a delayed first output edge control signal; and
logically combining the delayed first output edge control signal with the second output edge control signal to generate the first partial output signal.

42. The method of claim 38, wherein the negative sample output signals include a first pair of negative sample signals and a second pair of negative sample signals, the method further comprising:
seventh logically combining a third rising-edge timing instruction with the first pair of negative sample signals to generate a third rising-edge gated timing instruction;
eighth logically combining a fourth falling-edge timing instruction with the second pair of negative sample signals to generate a third falling-edge gated timing instruction; and
ninth logically combining the third rising-edge gated timing instruction and the third falling-edge gated timing instruction to generate a third output edge control signal.

43. The method of claim 42, further comprising:
tenth logically combining a fifth rising-edge timing instruction with the second pair of negative sample signals to generate a fourth rising-edge gated timing instruction;
eleventh logically combining a sixth falling-edge timing instruction with the second pair of negative sample signals to generate a fourth falling-edge gated timing instruction; and
twelfth logically combining the fourth rising-edge gated timing instruction and the fourth falling-edge gated timing instruction to generate a fourth output edge control signal.

44. The method of claim 43, further comprising:
delaying the third output edge control signal to generate a delayed third output edge control signal; and
logically combining the delayed third output edge control signal with the fourth output edge control signal to generate the second partial output signal.
fourth falling-edge gated timing instruction to generate a fourth output edge control signal.

* * * * *